United States Patent
Chadwick et al.

(10) Patent No.: US 9,865,361 B2
(45) Date of Patent: Jan. 9, 2018

(54) DIAGNOSTICS FOR A MEMORY DEVICE

(71) Applicant: Invecas, Inc., Santa Clara, CA (US)

(72) Inventors: Thomas Chadwick, Essex, VT (US);
Kevin W. Gorman, Essex, VT (US);
Nancy Pratt, Essex, VT (US)

(73) Assignee: Invecas, Inc., Santa Clara, CA (US)

( * ) Notice: Subject to any disclaimer, the term of this patent is extended or adjusted under 35 U.S.C. 154(b) by 92 days.

(21) Appl. No.: 15/140,242

(22) Filed: Apr. 27, 2016

(65) Prior Publication Data
US 2017/0316837 A1    Nov. 2, 2017

(51) Int. Cl.
*G11C 29/00* (2006.01)
*G11C 29/38* (2006.01)
*G11C 29/44* (2006.01)

(52) U.S. Cl.
CPC .............. *G11C 29/38* (2013.01); *G11C 29/44* (2013.01)

(58) Field of Classification Search
CPC ................................ G11C 29/38; G11C 29/44
See application file for complete search history.

(56) References Cited

U.S. PATENT DOCUMENTS

| | | | | |
|---|---|---|---|---|
| 5,604,756 A | * | 2/1997 | Kawata | ................. G11C 29/26 714/718 |
| 6,397,363 B1 | * | 5/2002 | Maeno | ................. G11C 29/40 714/704 |

* cited by examiner

*Primary Examiner* — Sam Rizk
(74) *Attorney, Agent, or Firm* — Venture Pacific Law, PC

(57) ABSTRACT

A memory diagnostic system comprises a test engine and a miscompare logic. The test engine provides test instructions with expected data to a memory under test ("MUT"). The MUT processes such test patterns and outputs the results of such test patterns as stored data. The miscompare logic has local miscompare logics and a global miscompare logic. Each of the local miscompare logics compares a predefined range of bits of the expected data with a corresponding predefined range of bits of the stored data. One or more miscompare flags are generated for one or more miscompares determined by the local miscompare logics. The global miscompare logic monitors the one or more miscompare flags. When a total number of the miscompare flags exceeds a threshold number, the global miscompare logic generates a pause signal to the local miscompare logics to capture a current state of the local miscompare logics.

22 Claims, 7 Drawing Sheets

DIAGNOSTICS FOR A MEMORY DEVICE

FIELD OF INVENTION

The present disclosure relates to circuits, methods, and systems for memory diagnostics, and, more particularly, to memory diagnostics that are compatible with built-in self-test ("BIST") systems for a memory device.

BACKGROUND

More memory is being embedded into system-on-chip ("SOC") devices in order to provide increasing functionality. Many SOC devices have more than 50% of their area devoted to embedded memories. Ensuring these memories are valid and operating correctly is of the upmost importance for producing SOC devices. In addition, as memory content increases, the memories become more susceptible to defects and variations in the chip parametric as technology feature sizes decrease.

Any reasonable SOC solution requires extensive memory diagnostic capability (i.e., the ability to produce maps of failing memory bits or "bit fail maps") in order to understand memory failure modes. This becomes critical to debugging memory marginalities, improving memory designs, identifying manufacturing process weaknesses, and developing excellent product yields.

To further complicate matters, larger sizes of memory blocks are making high speed collection of high quality diagnostic data much more difficult. Built-in self-test ("BIST") solutions need to identify failing locations within just a few high speed clock cycles by observing memory outputs that may be located across a region of hundreds of microns.

FIG. 1 illustrates a block diagram for a traditional miscompare logic for memory diagnostics. A traditional miscompare logic comprises bit comparators 8a-8c, an OR gate 16, a fail counter 18, a comparator 26, and an AND gate 20. The bit comparator 8a comprises an XOR gate 10a, a multiplexer 12a, and a flip-flop 14a; the bit comparator 8b comprises an XOR gate 10b, a multiplexer 12b, and a flip-flop 14b; and the bit comparator 8c comprises an XOR gate 10c, a multiplexer 12c, and a flip-flop 14c. The number of bit comparators 8a-8c depends on a data width of the data from a memory under test ("MUT"). As such, the number of bit comparators 8a-8c can be adjusted to fit the data width from the MUT. The fail counter 18 comprises an adder 19, a multiplexer 22, and multi-bit flip-flops 24 for storing the counter value. The fail counter 18 counts the number of miscompare flags outputted by the OR gate 16.

The test engine (e.g., a BIST or other memory test engine) inputs test patterns having control commands, address(es), and data to the MUT to run diagnostics on the MUT. The MUT performs operations according to the test patterns. The results of those operations are outputted as stored data. The XOR gates 10a-10c receive the stored data from the MUT and expected data from the test engine to determine if there are any mismatches between the stored data and the expected data of the test patterns.

In particular, the XOR gates 10a-10c compare the stored data[0]-[n] and the expected data[0]-[n] bit-by-bit. For instance, a stored data[0] at bit position 0 and expected data[0] at bit position 0 are compared to each other by the XOR gate 10a to determine if there is a mismatch (also referred to as a miscomparison) between the two values. The output of the XOR gate 10a is coupled to an input of the multiplexer 12a. An output of the multiplexer 12a is coupled to an input of the flip-flop 14a. The flip-flop 14a can store the miscomparison found by the XOR gate 10a. The output of the flip-flop 14a is coupled to the OR gate 16. The output of the flip-flop 14a is also coupled to another input of the multiplexer 12a. When a diagnostic pause is generated by the AND gate 20, the diagnostic pause selects the flip-flop 14a's current output to output from the multiplexer 12a to the flip-flop 14a. In this manner, the diagnostic pause can freeze the state of the flip-flops 14a-14c to its last inputted value.

Likewise, the bit comparators 8b and 8c also have an XOR gate, a multiplexer, and a flip-flop that are serially connected to compare stored data and expected data at a relative bit position. Those findings are further inputted to the OR gate 16 for accumulation. If any one of the bit comparators 10a-10c provide a logic high (i.e., a miscomparison is found for one or more of the bits), the OR gate 16 will generate a miscompare flag indication at its output. Generally, a low logic signal can indicate that the bit-by-bit comparison resulted in a match and a high logic signal can indicate a miscompare flag was generated based on one or more miscomparisons.

Miscompare flags are accumulated by the fail counter 18. The miscompare signal from the OR gate 16 is inputted to the multiplexer 22 for selection of one of the multiplexer 22's input. The integer adder 19 adds one to the output of the multi-bit flip-flops 24 which keeps a running tally of the number of miscompare flags that have been generated. That increased value is inputted to the multiplexer 22 which is outputted to the multi-bit flip-flops 24 to store this increased value. If the miscompare signal is low, then the multiplexer 22 selects an input of the multiplexer 22 that is tied to the output of the multi-bit flip-flops 24 to maintain the value stored in the multi-bit flip-flops 24 at the currently stored value. If the miscompare signal is high, then the multiplexer 22 selects an input of the multiplexer 22 that is tied to the output of the adder 19 to increase the value stored by the multi-bit flip-flops 24 by one.

The outputted value of the multi-bit flip-flops 24 is inputted to the comparator 26 to determine if the fail counter value has reached a predefined threshold value of miscompare flags. If so, the comparator 26 issues a high logic value to the AND gate 20. Upon the next miscompare flag (i.e., when the miscompare signal goes high), the AND gate 20 will generate a diagnostic pause, which is inputted to the multiplexers 12a-12c to freeze the states of the flip-flops 14a-14c.

Operationally, the miscompare logic generates a composite miscompare signal from the bitwise XOR results of the XOR gates 10a-10c. The AND gate 20 gates the composite miscompare signal with whether the value of the fail counter has reached the predefined threshold value to determine if the miscompare logic should pause. This architecture is limited in its maximum operating frequency by the fan-in from the XOR flip-flops, through the OR and AND gates, and the fan-out back to the flop-flops, all of which must be accomplished in one clock cycle. Thus, such miscompare logic system may be inaccurate due to not being able to perform the fan-in and fan-out within a cycle.

Therefore, it is desirable to provide methods, apparatuses, and systems for an extensible memory diagnostic solution. In such methods, apparatuses, and systems, it is also desirable to have one or more of the following key features: supporting high speed data collection with minimal circuit overhead; supporting large memories of varying dimensions with critical test outputs spaced along one or more edges;

and providing key information in an easy to process state to simplify the software support required to generate memory bit fail maps.

SUMMARY OF INVENTION

Briefly, the disclosure relates to a memory diagnostic system, comprising: a test engine, wherein the test engine provides test instructions having expected data to a memory under test and wherein stored data is outputted from the MUT based on the test instructions; and a miscompare logic having local miscompare logics and a global miscompare logic, wherein each of the local miscompare logics compares a predefined range of bits of the expected data with a corresponding predefined range of bits of the stored data, wherein one or more miscompare flags are generated for one or more miscompares determined by the local miscompare logics, wherein the global miscompare logic monitors the one or more miscompare flags, and wherein, when a total number of the miscompare flags exceeds a threshold number, the global miscompare logic generates a pause signal to the local miscompare logics to capture a current state of the local miscompare logics.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. It is understood that a miscompare logic of the present disclosure can be part of a system-on-chip ("SOC") device. To aid in the understanding of the present disclosure, other components known to the current art within a SOC device may be omitted from the following description. However, it is appreciated by a person having ordinary skill in the art that the miscompare logic of the present disclosure can work in conjunction with such components.

The present disclosure proposes an area-efficient high speed memory diagnostics across a wide range of memory types (including large memories with critical test outputs spaced along one or more edges). A diagnostic method and system of the present disclosure is compatible with typical BIST solutions (e.g., any BIST logic for generating test patterns at a high speed can be used with the present disclosure). A modular design can be implemented for a wide memory data bus by dividing the memory data bus into a number of segments, each of which is associated with a local miscompare logic. The local miscompare logic can be further coupled to and interoperated with a global miscompare logic.

Figure 1:
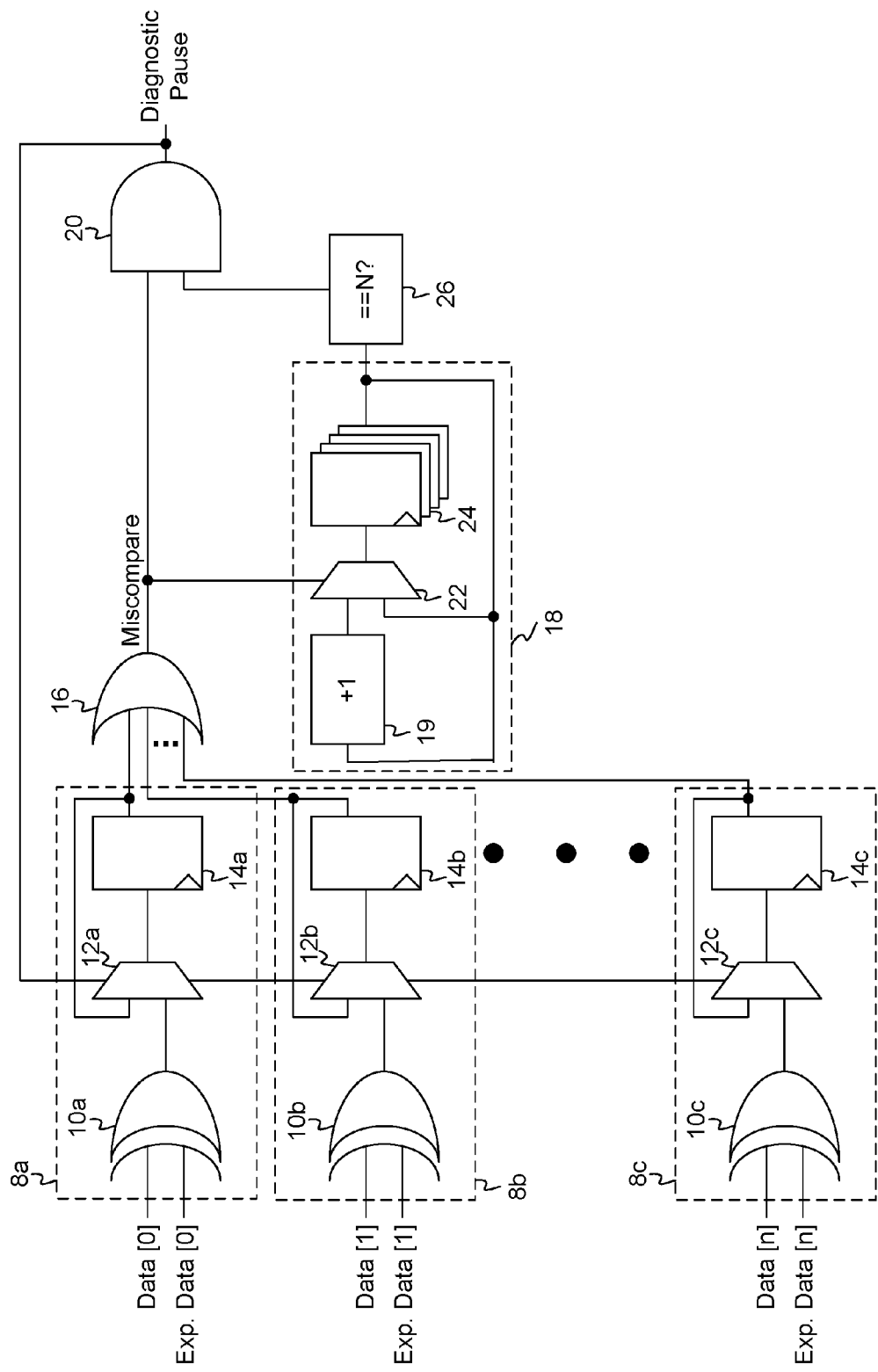
FIG. 1 illustrates a block diagram for a prior art miscompare logic for memory diagnostics.
Figure 2:
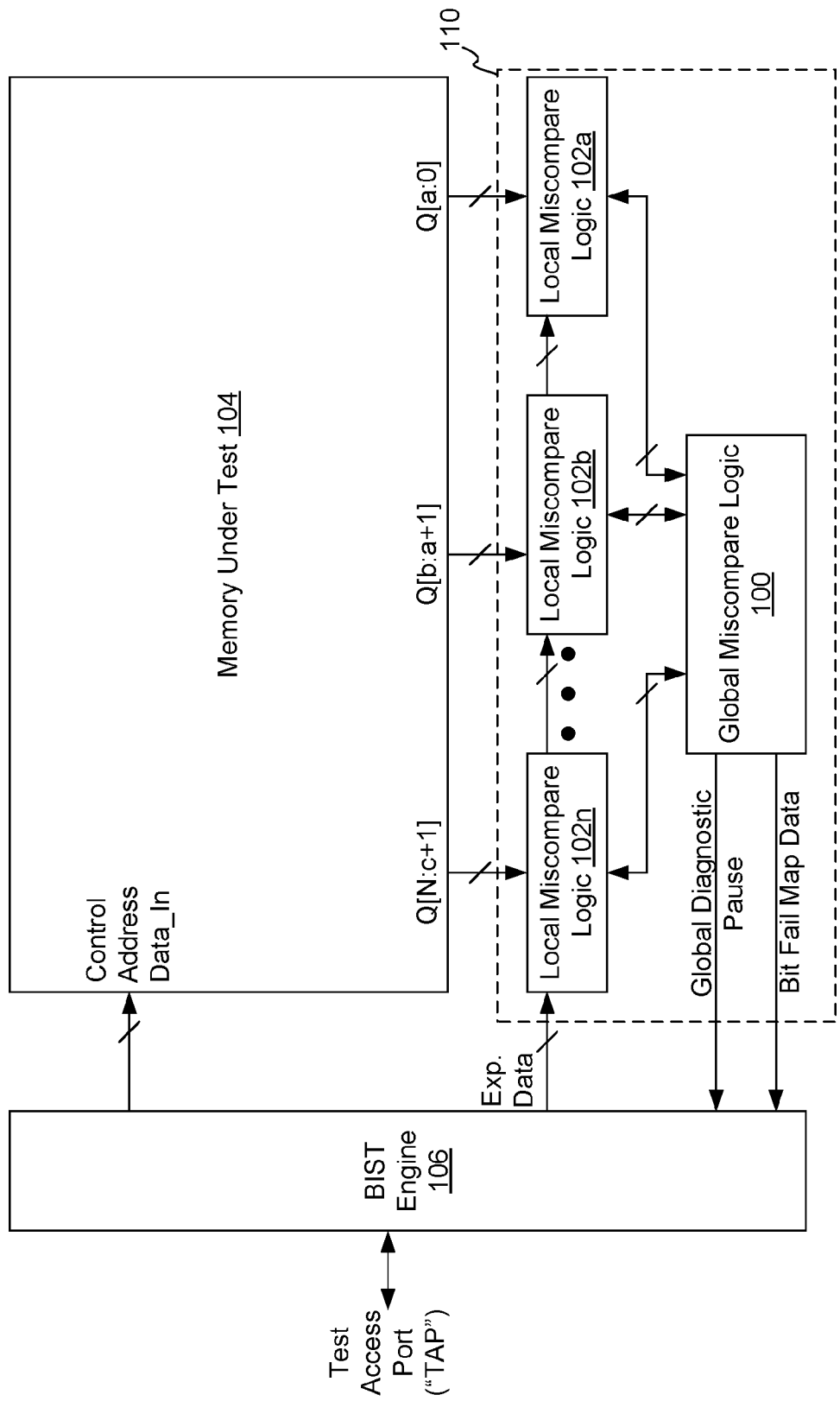
FIG. 2 illustrates a block diagram for a memory diagnostic system of the present disclosure having a global miscompare logic and local miscompare logics.

FIG. 2 illustrates a block diagram for a memory diagnostic system of the present disclosure having a global miscompare logic and local miscompare logics. A memory diagnostic system of the present disclosure comprises a BIST engine (or other test engine) 106 and a miscompare logic 110 for testing an MUT 104. The miscompare logic 110 comprises circuitry for tracking miscompares that can be used multiple times for testing the MUT 104 with many data outputs. The number of data outputs from the MUT 104 that need to be controlled at high speed by any one logic block is limited by having multiple instances of local miscompare logics to handle segments of the data outputs to compare. Thereby, higher performance designs are enabled with less circuit overhead. It is appreciated that a BIST engine is widely known in the current art as well as various memories types. For the sake of clarity, detailed descriptions of such blocks are omitted to focus on memory diagnostics. It is understood that a person having ordinary skill in the art can implement various test engines and various memories in conjunction with the present disclosure.

The BIST engine 106 provides test patterns to the MUT 104, where the test patterns comprise control commands, addresses, and data-in to the MUT 104. The MUT 104 can process the test patterns, where the results of each test pattern can be outputted bit-by-bit via the data out bits of the MUT 104, referred to by stored data Q[n]. The miscompare logic 110 comprises local miscompare logics 102a-102n and a global miscompare logic 100. The local miscompare logics 102a-102n each perform comparisons for a subset of the data out bits Q[n]. Thus, the number of local miscompare logics can depend on the bit width of the MUT 104 and the number of bits each one of the local miscompare logics 102a-102n are assigned to handle.

For instance, the MUT 104's output data width can be 128 bits and two local miscompare logics can be assigned to handle 64 bit segments of the 128-bit data width. The first of the two local miscompare logics can compare bits 0-63 of the bit width, and the second of the two local miscompare logics can compare bits 64-127 of the bit width. In another embodiment, the output data width of the MUT can be 256 bits, such that there are four local miscompare logics. The first one of the four local miscompare logics can compare bits 0-63 of the bit width; the second one of the four local miscompare logics can compare bits 64-127 of the bit width; the third one of the four local miscompare logics can compare bits 128-191 of the bit width; and the four one of the four local miscompare logics can compare bits 192-255 of the bit width. It is appreciated that a person having ordinary skill in the art can adjust a number of local miscompare logics and a data width of the MUT to fit a particular design. In order to illustrate the system of the present disclosure, the number of local miscompare logics is shown to be three. However, this is merely for illustrative purposes with the intention that any number from two or more local miscompare logics can be used to fit a particular output data width of the MUT.

The local miscompare logics 102a-102n generate local miscompare flags for their respective subsets of the MUT data width and report back to the global miscompare logic 100 to accumulate that information and act accordingly.

When a predefined number of miscompare flags is received by the global miscompare logic 100, the global miscompare logic 100 can pause the BIST engine 106 when a next miscompare flag is received. The diagnostic pause can be fed back to the local miscompare logics 102a-102n to freeze the states of the local miscompare logics 102a-102n so that a bit fail map entry can be populated with information from the bit comparators of the local miscompare logics 102a-102n. The bit fail map entry can then be outputted to the BIST engine 106 or off-chip for analysis.

Figure 3:
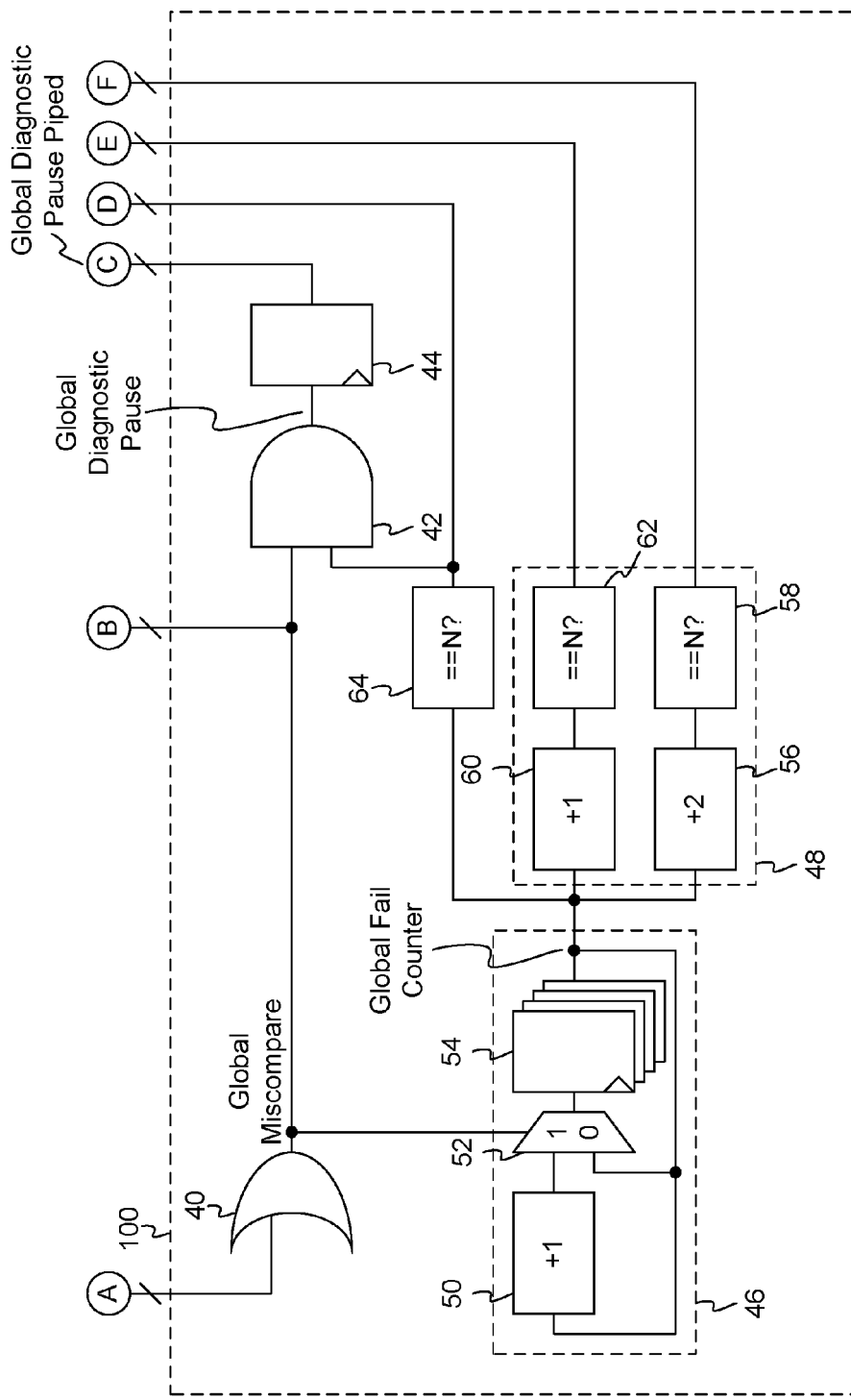
FIG. 3 illustrates a block diagram for a global miscompare logic of the present disclosure.

FIG. 3 illustrates a block diagram for a global miscompare logic of the present disclosure. A global miscompare logic comprises an OR gate 40, an AND gate 42, a flip-flop 44, a global fail counter 46, a look-ahead logic 48, and a comparator 64. The OR gate 40 receives local miscompare signals from the local miscompare logics 102a-102n. If any of those miscompare signals indicate a local miscompare flag, the OR gate 40 generates a global miscompare flag which is inputted to the AND gate 42 and the global fail counter 46.

The global miscompare signal from the OR gate 40 is inputted to the multiplexer 52 for selection of one of the multiplexer 52's inputs. The integer adder 50 adds one to the output of the multi-bit flip-flops 54 which keeps a running tally of the number of global miscompare flags that have been generated by the OR gate 40. That increased value is inputted to the multiplexer 52 which is outputted to the multi-bit flip-flops 54 to store this increased value. If the global miscompare signal is low, then the multiplexer 52 selects an input of the multiplexer 22 that is tied to the output of the multi-bit flip-flops 54 to maintain the value stored in the multi-bit flip-flops 54 as the currently stored value. If the global miscompare signal is high, the multiplexer 52 selects an input of the multiplexer 22 that is tied to the output of the adder 50 to increase the value stored in the multi-bit flip-flops 54 by one. The multi-bit flip-flops 54 can then save this increased value. The stored value in the multi-bit flip-flops 54 is the global fail counter. The global fail counter can be reset as needed or desired.

The global fail counter is outputted by the multi-bit flip-flops 54 to the comparator 64 to determine if the global fail counter has reached a predefined threshold value N of global miscompare flags. If so, the comparator 64 issues a high logic value to the AND gate 42. When a next global miscompare signal is also high, then a global diagnostic pause is generated by the AND gate 42, and then distributed to the BIST engine 106 and the local miscompare logic 102a-102n via the flip-flop 44.

The look-ahead logic 48 also receives the global fail counter and provides a predefined number of next integer values for the global fail counter by adding one, two, or another integer value to the current value of the global fail counter using adders 56 and 60. The next integer values are inputted to comparator blocks 58 and 62 (also referred to as "look-ahead comparators") to determine if those next integer values have reached the predefined threshold value for the global miscompare flags. The comparator blocks 58 and 62 output those determinations (also referred to as indicators) to the local miscompare logics 102a-102n. The local miscompare logics 102a-102n can use this information to determine whether a respective, next one or more local miscompare flags should trigger a global diagnostic pause.

The look-ahead logic 48 can comprise serially-connected adder 60 and comparator 62 and serially-connected adder 56 and comparator 58. The serially-connected adder 60 and comparator 62 determine whether the global fail counter plus one equals the predefined threshold value. The serially-connected adder 56 and comparator 58 determine whether the global fail counter plus two equals the predefined threshold value. The determinations from the comparators 64, 62, and 58 are outputted to the local miscompare logics 102a-102n.

Figure 4:
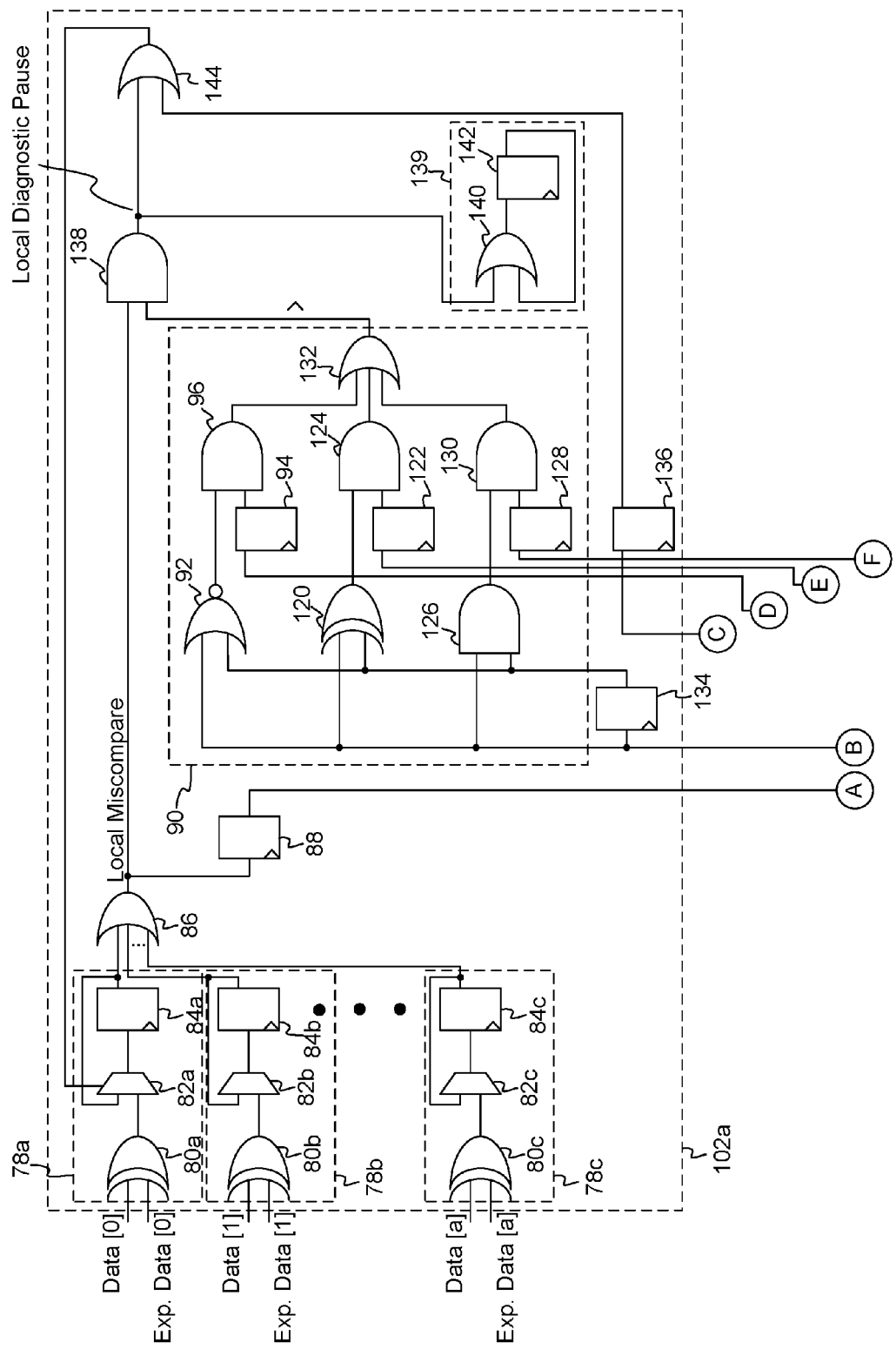
FIG. 4 illustrates a block diagram for a local miscompare logic of the present disclosure.

FIG. 4 illustrates a block diagram for a local miscompare logic of the present disclosure. The local miscompare logics 102a-102n are modular components that can be implemented to generate local miscompare flags for a segment of the data output of the MUT 104. Thus, each of the local miscompare logics 102a-102n may comprise substantially similar circuitry. To avoid unnecessary duplication, the local miscompare logic 102a is described in detail, which can be representative of the implementation details of the other local miscompare logics. It is appreciated that the other miscompare logics 102b-102n are similar in structure and are coupled to different segments of the data output of the MUT 104.

The local miscompare logic 102a comprises bit comparators 78a-78c, an OR gate 86, flip-flops 88, 134, and 136, history-aware logic 90, an AND gate 138, a local pause storage 139, and an OR gate 144. The bit comparator 78a comprises an XOR gate 80a, a multiplexer 82a, and a flip-flop 84a; the bit comparator 78b comprises an XOR gate 80b, a multiplexer 82b, and a flip-flop 84b; and the bit comparator 78c comprises an XOR gate 80c, a multiplexer 82c, and a flip-flop 84c. The number of bit comparators 78a-78c can depend on the number of bits designed to be covered by the local miscompare logic 102a. It is understood that this number can be varied accordingly to fit a particular design. Furthermore, predictive and the history-aware logic 90 aid in compensating for the potential loss of data resulting from the introduction of the pipeline flip-flops 44, 136, and 88.

The bit comparators 78a-78c determine if there are any mismatches between respective stored data [0]-[a] from the MUT 104 and the expected data [0]-[a] from the BIST engine 106. The outputs of the bit comparators 78a-78c are coupled to inputs of the OR gate 86. If any of the bit comparators 78a-78c determine a miscomparison (e.g., by outputting a high logic state), the OR gate 86 will generate a local miscompare flag (e.g., a high logic output). The output of the OR gate 86 is coupled to an input of the AND gate 138 and an input of the flip-flop 88. The flip-flop 88 stores that information and can output such value to the OR gate 40 of the global miscompare 100 for generating a global miscompare signal.

The AND gate 138 also receives an output of the history-aware logic 90. The history-aware logic 90 comprises a NOR gate 92, an XOR gate 120, an AND gates 126, 96, 124, and 130, an OR gate 132, and flip-flops 94,122, and 128. The global miscompare signal from the global miscompare logic 100 is inputted to the NOR gate 92, the XOR gate 120, and the AND gate 126 of the history-aware logic 90. The global miscompare signal is also inputted to the flip-flop 134 for storage. Upon a next clocking cycle for the flip-flop 134, the flip-flop 134 outputs the one cycle delayed global miscompare signal to the NOR gate 92, the XOR gate 120, and the AND gate 126 of the history-aware logic 90. The NOR gate 92, the XOR gate 120, and the AND gate 126 are operated such that only one of their outputs can be a high logic value "1" at any single point in time (although their outputs can all be low).

The NOR gate 92 determines whether there have been any global miscompare flags initiated in the past two clock cycles. If not, then a high logic state is outputted from the NOR gate 92 to the AND gate 96. The comparator 64 outputs to the flip-flop 94 a determination whether the predefined threshold N for global miscompares has been reached. If so, that determination is outputted to another input of the AND gate 96. If both inputs of the AND gate 96 are high, then the AND gate 96 outputs a high logic state to the OR gate 132, which in turn outputs a high logic state to the AND gate 138 of the local miscompare logic 102a.

The XOR gate 120 determines whether there have been one global miscompare flag initiated in the past two clock cycles. If so, then a high logic state is outputted from the XOR gate 120 to the AND gate 124. The comparator 62 outputs to the flip-flop 122 a determination whether the predefined threshold N for global miscompares plus one has been reached. The determination is outputted to another input of the AND gate 124. If both inputs of the AND gate 124 are high, then the AND gate 124 outputs a high logic state to the OR gate 132, which in turn outputs a high logic state to the AND gate 138 of the local miscompare logic 102a.

The AND gate 126 determines whether there have been two global miscompare flags initiated in the past two clock cycles. If so, then a high logic state is outputted from the AND gate 126 to the AND gate 130. The comparator 58 outputs to the flip-flop 128 a determination whether the predefined threshold N for global miscompares plus two has been reached. The determination is outputted to another input of the AND gate 130. If both inputs of the AND gate 130 are high, then the AND gate 130 outputs a high logic state to the OR gate 132, which in turn outputs a high logic state to the AND gate 138 of the local miscompare logic 102a.

If both the local miscompare signal from the OR gate 86 and the output of the history-aware logic 90 are high, then the AND gate 138 generates a logic high signal to the OR gate 144. The output of the AND gate 138 is stored by the local pause storage 139. The local pause storage 139 can be implemented by a serially connected OR gate 140 and a flip-flop 142. The purpose of the local pause storage 139 is to determine which one of the local miscompare logics generated a miscompare flag before the global diagnostic pause is generated. This can be beneficial for understanding which one of the local miscompare logics failed. This can also be an optional block in the respective system since a bit fail map entry can also provide such information.

If a local pause signal (e.g., a high logic state) from the AND gate 138 is inputted to the OR gate 144 or the global diagnostic pause is inputted to the OR gate 144 via the flip-flop 136, the OR gate 144 will generate a local pause signal to pause the bit-comparators 78a-78c to freeze the last state of those comparators for review in the bit fail map entry.

The use of pipeline flip-flops for distributing the global diagnostic pause signal and for distributing the local miscompare signals provides the ability to break a potentially large fan-in/fan-out logic path to smaller component parts. Each of the logic paths can have at least one cycle in which to resolve, thus improving maximum operating frequency. For instance, the flip-flop 44 of the global miscompare logic and the flip-flops 136 of the respective local miscompare logics distribute the global diagnostic pause signal in a fan-out logic path. The flip-flops 88 of the local miscompare logics distribute any respective local miscompare signals to the global miscompare logic in a fan-in logic path.

The miscompare logic 110 can gather each of the bit comparator results of the local miscompare logics to populate a bit fail map entry. The bit fail map entry can then be outputted to the BIST engine 106. Table 1 below illustrates an example of a data structure for a bit fail map entry. In such example for illustrative purposes, it can be assumed that there are two local miscompare logics in the miscompare logic and an MUT data width of 128 bits. The data structure outputted to the BIST engine in such example can comprise the following fields and bit locations in the data structure.

TABLE 1

| Bit Position | [140] | [139:130] | [129:66] | 65 | [64:1] | 0 |
|---|---|---|---|---|---|---|
| Data | Read/Write Enable | Word Address[9:0] | Bitwise XOR[127:64] | Pause Flag[1] | Bitwise XOR[63:0] | Pause Flag[0] |

It can be appreciated that other data structures can be used to convey such information and that the data width and number of local miscompare logics can also vary depending on the design.

The present disclosure for a miscompare logic provides for local and global components to improve the performance of the diagnostic pause function by introducing a pipeline stage between the fan-in and fan-out functions. For instance, the look-ahead logic 48 and the history-aware logic 90 are necessary to account for a preset number of cycles (e.g., 2 cycles) of delay between when a local miscompare signal is detected, the global fail counter 46 increments, and the result of the global fail counter 46's comparison is distributed to the local miscompare logic blocks 102a-102n. It is appreciated that the preset number of cycles can be designed to handle various number of clock cycles. The present figures are illustrated with a history aware logic and look-ahead logic that look to the past two clock cycles. However, it is understood that the present disclosure can apply to additional number of clock cycles and/or number of miscompare flags by implementing additional logic within the history aware logic and look-ahead logic to account for those additional cycles and flags.

Assuming the preset number of cycles is two, if the global miscompare was zero in both of the two preceding cycles, then the "fail count==N?" path will be chosen to gate the local miscompare. If the global miscompare was one in only one of the two preceding cycles, then the "fail count+1==N?" path will be chosen to gate the local miscompare. If the global miscompare was one in both of the two preceding cycles, then the "fail count+2==N?" path will be chosen to gate the local miscompare.

The global diagnostic pause can also be used to capture the values of other signals which are important for failure analysis, such as the state of a read/write control signals and one or more address busses at the memory under test. The bitwise XOR flip-flops of the bit comparators and the local diagnostic pause flip-flop storage can also be intended to be read out and analyzed off-chip. Typically, some kind of shift-register or scan capability can be used to accomplish this.

The local pause storage 139 value (referred to as the local pause flag) serves as a flag which indicates which instance(s) of the local compare logics resulted in the respective system entering the global pause state. For instance, if the local pause flag is high, then that can indicate the respective local compare logic had a miscompare flag. If the local pause flag is low, then that can indicate the respective local compare logic did not have a miscompare flag. The local pause flag is an important component of the failure analysis due to the fact that several cycles can elapse between when a local miscompare is determined and when the global diagnostic pause reaches the bitwise XOR flip-flops of the bit comparators in another instance of the local miscompare logic. It's possible that miscompares that come after the cycle of interest may be captured in the bitwise XOR flip-flops of the bit comparators in the other instance. Therefore, the contents of the bitwise XOR flip-flops of the bit comparators in the other instance should be disregarded if the associated local pause flag is not a one, i.e., had a local miscompare flag.

Figure 5:
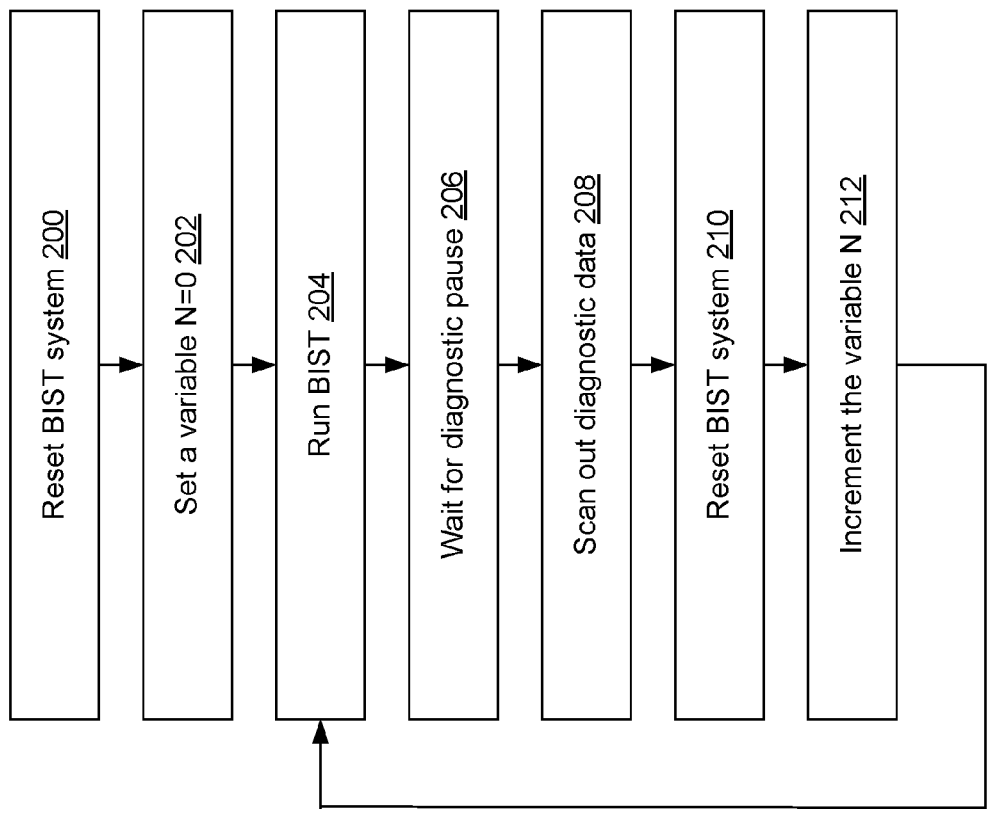
FIG. 5 illustrates a flow chart for operating a memory diagnostic system of the present disclosure.

FIG. 5 illustrates a flow chart for operating a diagnostics system of the present disclosure. In operating a diagnostics system of the present disclosure, a BIST system is reset, step 200. The predefined threshold value N for a fail counter can be set to zero, step 202. Next the BIST system is activated by running the BIST engine on a memory under test, step 204. As the test patterns are applied to the MUT, the diagnostics system can wait for a global diagnostic pause, step 206, by tallying the local miscompare flags until the predefined threshold number is exceeded (or reached in certain embodiments). Once that diagnostic data is received, the diagnostic data can be scanned out to the BIST engine, step 208. The scanning out can take a data structure form as illustrated in Table 1 or other data structure to provide a bit-map of the comparisons of the bits from data of the MUT and the expected data from the BIST engine. Next, the BIST system can be reset, step 210, which can include resetting the fail counter and test patterns. The predefined threshold value N can be incremented to a next value, e.g., plus one to the previous threshold value to run the diagnostics for the incremented threshold value, step 212. The steps can be iteratively performed, which starts at running the BIST system, step 204, with the incremented threshold value.

Figure 6:
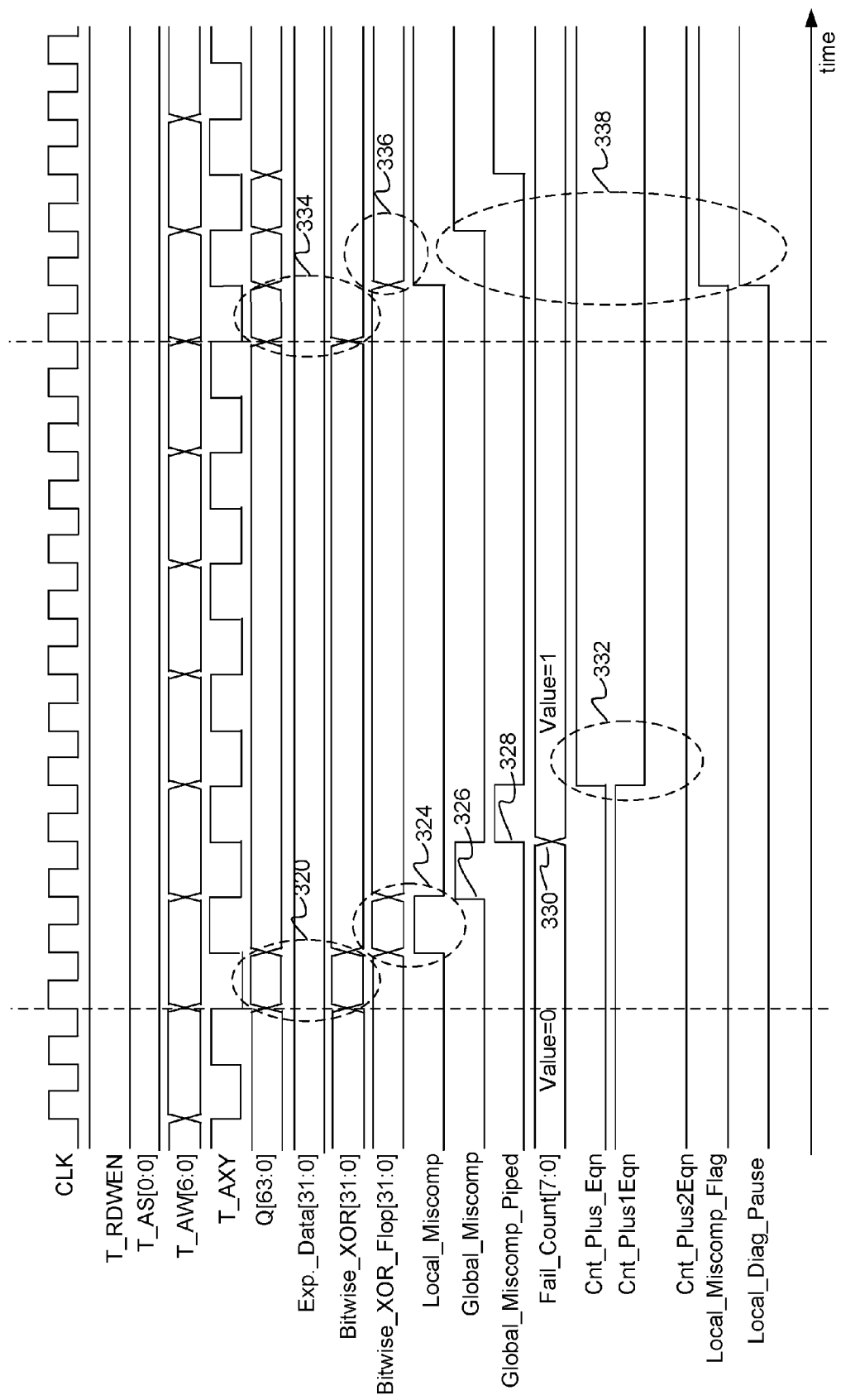
FIG. 6 illustrates a timing diagram for a memory diagnostic system of the present disclosure.

FIG. 6 illustrates a timing diagram for a memory diagnostic system of the present disclosure. In order to aid in the understanding of the present disclosure, a timing diagram for an example of a diagnostics system of the present disclosure is provided. The timing diagram can illustrates the following signals plotted in parallel along a time axis:
  a CLK signal can be provided to clock the diagnostics system;
  a T_RDWEN signal is a read/write-enable-not-input signal—when high, the memory performs a read, and when low, the memory performs a write;
  a T_AS[0:0] signal, a T_AW[6:0] signal, and a T_AXY signal are address inputs—these signals select the address from which data will be read or to which data will be written (depending on the state of the T_RDWEN signal);
  Q[63:0] signals are the stored data from the MUT that is outputted to the local miscompare logics;
  Exp._Data[31:0] signals for one of the local miscompare logics are the expected data from the BIST engine to the local miscompare logic;
  Bitwise_XOR[31:0] signals indicate the comparison of the first 32 bits of the stored data and the expected data by the bitwise XOR gates of the local miscompare logic;
  Bitwise_XOR_Flop[31:0] signals from flip-flops that store results of the comparisons from the bitwise XOR gates;
  a Local_Miscomp signal is a local miscompare signal from one of the local miscompare logics of a diagnostics system of the present disclosure (e.g., from an OR gate 86 illustrated in FIG. 4);
  a Global_Miscompare signal is a global miscompare signal of a diagnostics system of the present disclosure (e.g., from an OR gate 40 illustrated in FIG. 3);
  a Global_Miscompare_Piped signal is the piped global miscompare signal to the local miscompare logics;
  a Fail_Count[7:0] signal can indicate when the global fail counter is incremented (e.g., by the global fail counter 46 illustrated in FIG. 3);
  a Cnt_Plus_Eqn signal indicates whether the global fail counter equals the predefined threshold value (e.g., outputted by the flip-flop 94 of the global miscompare logic 100);
  a Cnt_Plus1_Eqn signal indicates whether the global fail counter plus one equals the predefined threshold value (e.g., outputted by the flip-flop 122 of the global miscompare logic 100);
  a Cnt_Plus2_Eqn signal indicates whether the global fail counter plus two equals the predefined threshold value (e.g., outputted by the flip-flop 128 of the global miscompare logic 100);
  a Local_Miscomp_Flag signal indicates whether a miscompare is detected by the respective local miscompare logic (e.g., the value of the input from the OR gate 144 illustrated in FIG. 4); and
  a Local_Diag_Pause signal indicates a local diagnostic pause (e.g., by the output of the AND gate 138 in FIG. 4).

The timing diagram illustrates a case where a global diagnostic pause is issued on the second miscompare flag, where the first miscompare flag and the second miscompare flag have a large separation in time. Furthermore, the data width of the MUT can be 64 bits. The respective diagnostics system can comprise two local miscompare logics to each handle 32 bits of the data width of the MUT. For illustrative purposes, timing diagrams for a second local miscompare logic are not shown. It can be assumed in this example that there are no miscomparisons found by the second local miscompare logic.

In area 320 of the timing diagram, a first miscompare is determined, i.e., a stored memory data mismatches with the expected data causing a bitwise XOR to be nonzero in the respective local miscompare logic. The first local miscompare can be captured by a bitwise XOR flop, thereby causing a local miscompare signal to be asserted, see area 324 of the timing diagram. The flopped local miscompare is outputted to the global miscompare logic, which causes a global miscompare signal to be generated, see area 326 of the timing diagram. The global miscompare signal is further piped back to the local miscompare logics, see area 328 of the timing diagram. The fail counter can be incremented from a value equal to zero to a value equal to one. This can happen one cycle after the global miscompare signal is asserted, see area 330 of the timing diagram.

A look-ahead logic of the global miscompare logic determines the following: (1) whether the fail counter equals the predefined threshold value, where the Cnt_Plus_Eqn signal indicates a result of such determination; (2) whether the fail counter plus one equals the predefined threshold value, where the Cnt_Plus1_Eqn signal indicates a result of such determination; and (3) whether the fail counter plus two equals the predefined threshold, where the Cnt_Plus2_Eqn signal indicates a result of such determination. Area 332 of the timing diagram illustrates such signals in this example.

A second local miscompare is determined (see area 334 of the timing diagram). The second local miscompare can be captured by a bitwise XOR flop and a local miscompare signal is asserted (see area 336 of the timing diagram). In this same cycle, Global_Miscomp and Global_Miscomp_Piped are both low logic values resulting in NOR gate 92 outputting a high logic value, "1". Since the output of the flip-flop 94, Cnt_Plus_Eqn, is also "1", AND gate 96 outputs "1", OR gate 132 outputs "1", and AND gate 138 outputs "1", resulting in the Local_Diag_Pause signal equal to 1 (see area 338 of the timing diagram). This local diagnostic pause causes the select on MUXes 82a-82c to switch such that the flip-flops 84a-84c capture and hold onto the data associated with the second local miscompare.

Figure 7:
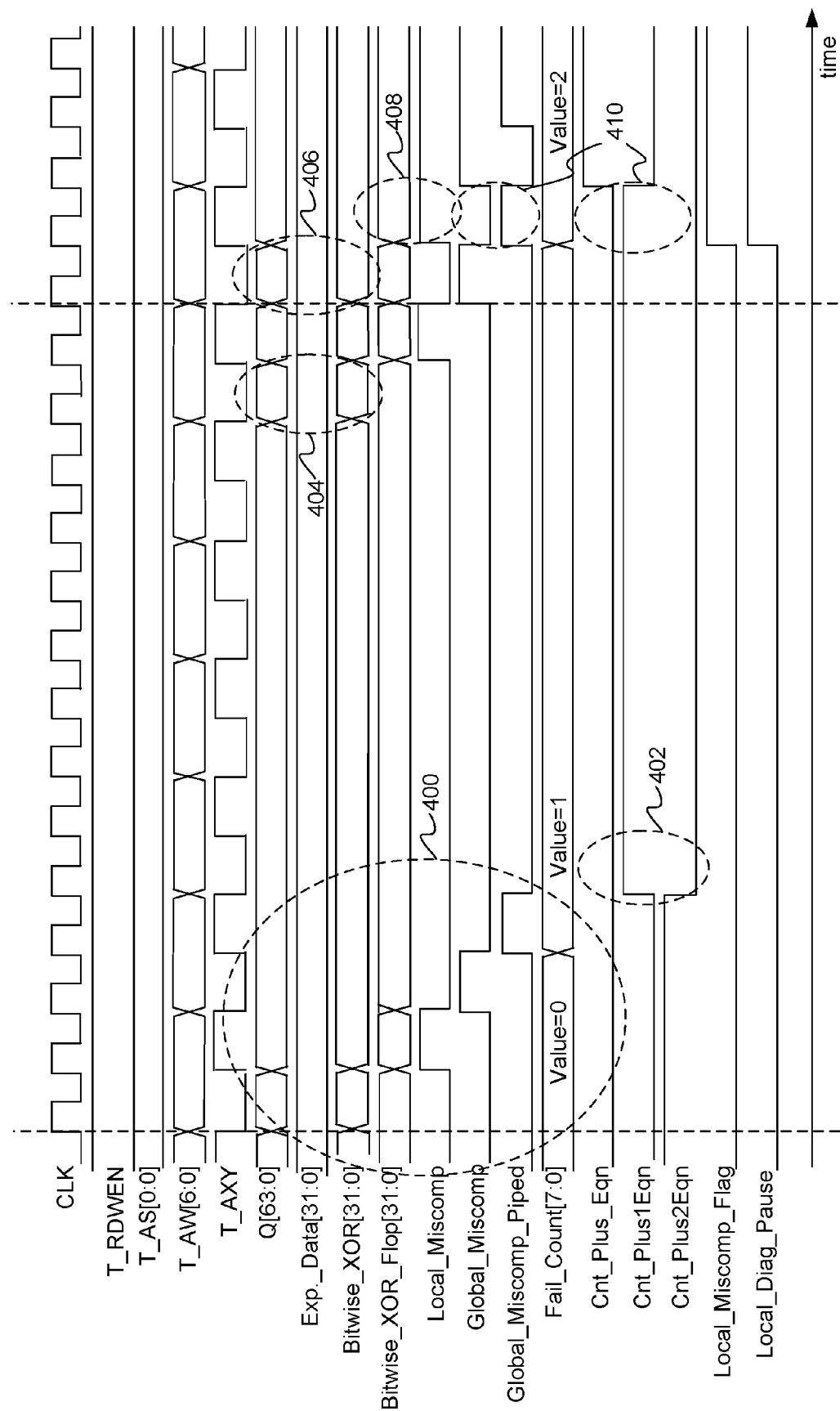
FIG. 7 illustrates another timing diagram for a memory diagnostic system of the present disclosure.

FIG. 7 illustrates another timing diagram for a memory diagnostic system of the present disclosure. In another example, a timing diagram for a diagnostics system of the present disclosure is provided. However, in this example, the timing diagram illustrates a case where a global diagnostic pause is issued on the third miscompare flag, where the second miscompare flag and the third miscompare flag are separated by one cycle. The data width of the MUT can remain at 64 bits. The respective diagnostics system can comprise two local miscompare logics to each handle 32 bits of the data width of the MUT. Similarly to the previous example, only the signals for one of the local miscompare logics is shown under the assumption that this certain local miscompare logic is determining the miscomparisons.

Area 400 illustrates the first two miscompare flags and resulting waveforms, similar to the previous timing diagram in FIG. 6. In particular, a first miscompare is determined, i.e., a memory output mismatches the expected data causing a bitwise XOR to be nonzero in one of the local miscompare logics. The first local miscompare can be captured by a bitwise XOR flop and a local miscompare signal is asserted. The flopped local miscompare is outputted to the global miscompare logic, which causes a local miscompare signal to be generated. The global miscompare signal is further piped back to the local miscompare logics. The fail counter can be incremented, from value=0 to value=1, one cycle after the global miscompare signal is asserted.

A look-ahead logic of the global miscompare logic determines the following: (1) whether the fail counter equals the predefined threshold value, where the Cnt_Plus_Eqn signal indicates a result of such determination; (2) whether the fail counter plus one equals the predefined threshold value, where the Cnt_Plus1_Eqn signal indicates a result of such determination; and (3) whether the fail counter plus two equals the predefined threshold, where the Cnt_Plus2_Eqn signal indicates a result of such determination. Area 402 of the timing diagram illustrates such signals in this example.

Here, the predefined threshold can be set to two. Since the fail counter is currently at one, the Cnt_Plus_Eqn is at a low logic state to indicate that the fail counter does not equal the predefined threshold. The Cnt_Plus1_Eqn switches from low logic state to high logic state to indicate the fail counter equals the predefined threshold. The Cnt_Plus2_Eqn switches from a high logic state to a low high logic state to indicate the fail counter no longer equals the predefined threshold.

The second miscompare flag can be triggered by a mismatch in the bitwise XOR gate of the local miscompare logics, see area 404. The third miscompare flag can be triggered by another mismatch in a bitwise XOR gate of the local miscompare logics, see area 406. The bitwise XOR gate(s) can be stored in flip-flops, which in turn the local miscompare signal is asserted, see area 408.

In the same cycle in which Local_Miscomp transitions to "1", Global_Miscomp is "0" and Global_Miscomp_Piped is "1", resulting in the XOR gate 120 outputting "1" (see area 410 of the timing diagram). Since the output of the flip-flop 122, Cnt_Plus1_Eqn, is also "1", AND gate 124 outputs "1", OR gate 132 outputs "1" and AND gate 138 outputs "1", resulting in the Local_Diag_Pause signal equal to 1 (see area 410 of the timing diagram). This local diagnostic pause causes the select on MUXes 82a-82c to switch such that flip-flops 84a-84c capture and hold onto the data associated with the third local miscompare.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skill in the art.

We claim:

1. A memory diagnostic system, comprising:
   a test engine, wherein the test engine provides test instructions having expected data to a memory under test ("MUT") and wherein stored data is outputted from the MUT based on the test instructions; and
   a miscompare logic having local miscompare logics and a global miscompare logic,
   wherein each of the local miscompare logics compares a predefined range of bits of the expected data with a corresponding predefined range of bits of the stored data,
   wherein one or more miscompare flags are generated for one or more miscompares determined by the local miscompare logics,
   wherein the global miscompare logic monitors the one or more miscompare flags, and
   wherein the global miscompare logic generates a pause signal to the local miscompare logics to capture a current state of the local miscompare logics as a function of a total number of the miscompare flags and a threshold number.

2. The memory diagnostic system of claim 1 wherein the global miscompare logic comprises a look-ahead logic, wherein the look-ahead logic provides the local miscompare logics indicators of whether a next one or more miscompare flags reach the threshold number, and wherein the pause signal is generated when the total number of miscompare flags exceeds the threshold number.

3. The memory diagnostic system of claim 2 wherein the look-ahead logic comprises a plurality of adders and comparators for determining whether the next one or more miscompare flags reach the threshold number.

4. The memory diagnostic system of claim 1 wherein the local miscompare logics each comprise a history-aware logic and wherein the history-aware logic provides information on whether the threshold number has been reached in a number of cycles.

5. The memory diagnostic system of claim 4 wherein the history-aware logic comprises a first AND gate, a second AND gate, a third AND gate, and a OR gate, wherein the outputs of the first AND gate, the second AND gate, the third AND gate are inputted to the OR gate, wherein the first AND gate determines if the threshold number of miscomparisons has been reached in a threshold number of past cycles, wherein the second AND gate determines if the threshold number of miscomparisons plus a first integer number has been reached in the threshold number of past cycles, wherein the third AND gate determines if the threshold number of miscomparisons plus a second integer number has been reached in the threshold number of past cycles.

6. The memory diagnostic system of claim 5 wherein the output of the OR gate and a miscompare flag of the local miscompare logic is inputted to an AND gate, wherein the output of the AND gate initiates a local pause to the local miscompare logic.

7. The memory diagnostic system of claim 1 wherein each of the local miscompare logic blocks generates one or more miscompare flags if miscomparisons are found in the respective predefined range of bits of the expected data and the respective corresponding range of bits of the stored data.

8. The memory diagnostic system of claim 7 wherein the global miscompare logic block accumulates the one or more generated miscompare flags from the local miscompare logic blocks by a global fail counter.

9. The memory diagnostic system of claim 1 wherein, upon indication of the diagnostic pause, a bit fail map entry indicating bits of the stored data that have provided correct or incorrect values are generated by the miscompare logic and inputted to the test engine.

10. The memory diagnostic system of claim 1 wherein the global miscompare logic block comprises:
   an OR gate, wherein the OR gate receives any one or more generated miscompare flags from the local miscompare logic blocks and generates a global miscompare flag;
   a global fail counter, wherein the global fail counter counts a number of global miscompare flags generated by the OR gate;
   a comparator, wherein the comparator determines whether the number of global miscompare flags reaches the threshold number and wherein the comparator outputs to the local compare logic blocks;
   look-ahead block, wherein the look-ahead block determines whether any consecutive numbers after the number of global miscompare flags reach the threshold number, and wherein that determination is outputted to the local miscompare logic blocks;
   an AND gate, wherein an output of the comparator and an output of the global miscompare flag are inputted to the AND gate; and
   a flip-flop, wherein the flip-flop receives an output of the AND gate and transmits that output to all of the local miscompare logic blocks.

11. The memory diagnostic system of claim 1 wherein each of the local miscompare logic blocks comprise:
   bit comparator blocks, wherein the bit comparator blocks compare a bit of the expected data with a bit of the stored data;
   a first OR gate to receive outputs of the bit comparator blocks to generate a local miscompare flag, wherein the miscompare flag is outputted to the global miscompare logic;
   a history-aware block to determine whether the total number of miscompare flags have reached the threshold number;
   an AND gate, wherein the AND gate receives an output of the first OR gate and an output of the history-aware block;
   a second OR gate, wherein the second OR gate receives the AND gate's output and a global diagnostic pause from the global miscompare block;
   a pause indicator, wherein the pause indicator stores whether the local pause was caused by reaching of the threshold number of miscompare flags;
   a first flip-flop, wherein the first flip-flop stores the local miscompare flag and outputs the local miscompare flag to the global miscompare logic;
   a second flip-flop, wherein the second flip-flop stores a global miscompare flag and outputs the global miscompare flag with a predefined delay to the history-aware block; and
   a third flip-flop, wherein the third flip-flop stores the global diagnostic pause from the global miscompare logic and wherein the output of the third flip-flop is coupled to the input of the second OR gate.

12. A method for memory diagnostics using a miscompare logic having local miscompare logics and a global miscompare logic, comprising the steps of:
   providing test instructions having expected data by a test engine to a memory under test ("MUT"), wherein stored data is outputted from the MUT based on the test instructions;
   comparing a predefined range of bits of the expected data by the local miscompare logics with a corresponding predefined range of bits of the stored data;
   generating one or more miscompare flags for one or more miscompares determined by the local miscompare logics, wherein the global miscompare logic monitors the one or more miscompare flags; and
   when a total number of the miscompare flags exceeds a threshold number, generating by the global miscompare logic a pause signal to the local miscompare logics to capture a current state of the local miscompare logics.

13. The method for memory diagnostics of claim 12 wherein the global miscompare logic comprises a look-ahead logic and wherein the look-ahead logic provides the local miscompare logics indicators of whether a next one or more miscompare flags reach the threshold number.

14. The method for memory diagnostics of claim 13 wherein the look-ahead logic comprises a plurality of adders and comparators for determining whether the next one or more miscompare flags reach the threshold number.

15. The method for memory diagnostics of claim 12 wherein the local miscompare logics each comprise a history-aware logic and wherein the history-aware logic provides information on whether the threshold number has been reached in a number of cycles.

16. The method for memory diagnostics of claim 15 wherein the history-aware logic comprises a first AND gate, a second AND gate, a third AND gate, and a OR gate, wherein the outputs of the first AND gate, the second AND gate, the third AND gate are inputted to the OR gate, wherein the first AND gate determines if the threshold number of miscomparisons has been reached in a threshold number of past cycles, wherein the second AND gate determines if the threshold number of miscomparisons plus a first integer number has been reached in the threshold number of past cycles, wherein the third AND gate determines if the threshold number of miscomparisons plus a second integer number has been reached in the threshold number of past cycles.

17. The method for memory diagnostics of claim 16 wherein the output of the OR gate and a miscompare flag of the local miscompare logic is inputted to an AND gate, wherein the output of the AND gate initiates a local pause to the local miscompare logic.

18. The method for memory diagnostics of claim 12 wherein each of the local miscompare logic blocks generates one or more miscompare flags if miscomparisons are found in the respective predefined range of bits of the expected data and the respective corresponding range of bits of the stored data.

19. The method for memory diagnostics of claim 18 wherein the global miscompare logic block accumulates the one or more generated miscompare flags from the local miscompare logic blocks by a global fail counter.

20. The method for memory diagnostics of claim 12 wherein, upon indication of the diagnostic pause, a bit fail map entry indicating bits of the stored data that have provided correct or incorrect values are generated by the miscompare logic and inputted to the test engine.

21. The method for memory diagnostics of claim 12 wherein the global miscompare logic block comprises:
- an OR gate, wherein the OR gate receives any one or more generated miscompare flags from the local miscompare logic blocks and generates a global miscompare flag;
- a global fail counter, wherein the global fail counter counts a number of global miscompare flags generated by the OR gate;
- a comparator, wherein the comparator determines whether the number of global miscompare flags reaches the threshold number and wherein the comparator outputs to the local compare logic blocks;
- look-ahead block, wherein the look-ahead block determines whether any consecutive numbers after the number of global miscompare flags reach the threshold number, and wherein that determination is outputted to the local miscompare logic blocks;
- an AND gate, wherein an output of the comparator and an output of the global miscompare flag are inputted to the AND gate; and
- a flip-flop, wherein the flip-flop receives an output of the AND gate and transmits that output to all of the local miscompare logic blocks.

22. The method for memory diagnostics of claim 12 wherein each of the local miscompare logic blocks comprise:
- bit comparator blocks, wherein the bit comparator blocks compare a bit of the expected data with a bit of the stored data;
- a first OR gate to receive outputs of the bit comparator blocks to generate a local miscompare flag, wherein the miscompare flag is outputted to the global miscompare logic;
- a history-aware block to determine whether the total number of miscompare flags have reached the threshold number;
- an AND gate, wherein the AND gate receives an output of the first OR gate and an output of the history-aware block;
- a second OR gate, wherein the second OR gate receives the AND gate's output and a global diagnostic pause from the global miscompare block;
- a pause indicator, wherein the pause indicator stores whether the local pause was caused by reaching of the threshold number of miscompare flags;
- a first flip-flop, wherein the first flip-flop stores the local miscompare flag and outputs the local miscompare flag to the global miscompare logic;
- a second flip-flop, wherein the second flip-flop stores a global miscompare flag and outputs the global miscompare flag with a predefined delay to the history-aware block; and
- a third flip-flop, wherein the third flip-flop stores the global diagnostic pause from the global miscompare logic and wherein the output of the third flip-flop is coupled to the input of the second OR gate.

* * * * *